(12) United States Patent
Andrieu et al.

(10) Patent No.: US 11,024,544 B2
(45) Date of Patent: Jun. 1, 2021

(54) ASSEMBLY FOR 3D CIRCUIT WITH SUPERPOSED TRANSISTOR LEVELS

(71) Applicant: COMMISSARIAT A L'ENERGIE ATOMIQUE ET AUX ENERGIES ALTERNATIVES, Paris (FR)

(72) Inventors: Francois Andrieu, Saint-Ismier (FR); Lamine Benaissa, Massy (FR); Laurent Brunet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 10 days.

(21) Appl. No.: 16/221,939

(22) Filed: Dec. 17, 2018

(65) Prior Publication Data
US 2019/0198397 A1   Jun. 27, 2019

(30) Foreign Application Priority Data
Dec. 22, 2017   (FR) ...................................... 1763164

(51) Int. Cl.
*H01L 21/00* (2006.01)
*H01L 21/822* (2006.01)
(Continued)

(52) U.S. Cl.
CPC ...... *H01L 21/8221* (2013.01); *H01L 21/2007* (2013.01); *H01L 21/7688* (2013.01); *H01L 21/76801* (2013.01); *H01L 21/76879* (2013.01); *H01L 27/0688* (2013.01); *H01L 27/088* (2013.01); *H01L 27/1203* (2013.01); *H01L 21/823437* (2013.01); *H01L 21/823842* (2013.01)

(58) Field of Classification Search
CPC ............. H01L 21/8221; H01L 21/2007; H01L 21/76801
See application file for complete search history.

(56) References Cited

U.S. PATENT DOCUMENTS

| 2013/0193550 A1 | 8/2013 | Sklenard et al. |
| 2013/0203248 A1 | 8/2013 | Ernst et al. |

(Continued)

FOREIGN PATENT DOCUMENTS

| EP | 0 238 066 A2 | 9/1987 |
| FR | 2 961 016 A1 | 12/2011 |

OTHER PUBLICATIONS

U.S. Appl. No. 14/893,396, filed Nov. 23, 2015, 2016/0126215 A1, Bruno Imbert et al.

(Continued)

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

Fabrication of a circuit with superposed transistors includes assembly of a structure having transistors formed from a first semiconducting layer with a support provided with a second semiconducting layer in which transistors are provided on a higher level. The second semiconducting layer is coated with a thin layer of silicon oxide. The assembly of said structure and the support is made by direct bonding in which the thin silicon oxide layer is bonded to oxidised portions of getter material.

23 Claims, 6 Drawing Sheets

(51) Int. Cl.

| | |
|---|---|
| *H01L 21/768* | (2006.01) |
| *H01L 27/12* | (2006.01) |
| *H01L 27/06* | (2006.01) |
| *H01L 21/20* | (2006.01) |
| *H01L 27/088* | (2006.01) |
| *H01L 21/8238* | (2006.01) |
| *H01L 21/8234* | (2006.01) |

(56) References Cited

U.S. PATENT DOCUMENTS

| | | | |
|---|---|---|---|
| 2014/0217486 A1* | 8/2014 | Akiyama | H01L 27/14632 257/294 |
| 2015/0102419 A1 | 4/2015 | Ikeda et al. | |
| 2016/0211184 A1* | 7/2016 | Previtali | H01L 23/485 |
| 2019/0131274 A1* | 5/2019 | Wu | H01L 29/1054 |

OTHER PUBLICATIONS

U.S. Appl. No. 15/028,876, filed Apr. 12, 2016, 2016/0251250 A1, Lamine Benaissa et al.

U.S. Appl. No. 15/028,836, filed Apr. 12, 2016, 2016/0257597 A1, Lamine Benaissa et al.

U.S. Appl. No. 16/003,199, filed Jun. 8, 2018, 2018/0358381 A1, Yann Lamy et al.

U.S. Appl. No. 16/196,390, filed Nov. 20, 2018, Francois Andrieu.

U.S. Appl. No. 16/221,939, filed Dec. 17, 2018, Francois Andrieu, et al.

French Preliminary Search Report dated Sep. 24, 2018 in French Application 17 63164 filed on Dec. 22, 2017 (with English Translation of Categories of Cited Documents).

Shi, J. et al. "A 14 nm Finfet Transistor-level 3D partitioning Design to Enable High-Performance and Low-Cost Monolithic 3D IC", IEDM, 978-1-5090-3902-9, 2016, pp. 4.

Brunet, L. et al., "First demonstration of a CMOS ovor CMOS 3D VLSI CoolCube™ integration on 300mm wafers", 2016 Symposium on VLSI Tochnology Digest of Technical Papers, 978-1-5090-0638-0, 2016, pp. 2.

* cited by examiner

ASSEMBLY FOR 3D CIRCUIT WITH SUPERPOSED TRANSISTOR LEVELS

TECHNICAL DOMAIN AND PRIOR ART

This application relates to the field of integrated circuits containing components distributed on several levels, and particularly superposed transistors. Such devices are usually qualified as being 3-dimensional or "3D" integrated circuits.

It aims particularly at implementation of a 3D circuit with an upper stage of transistors provided with back control electrode(s) acting as back gate or a ground plane.

In general, in the field of integrated circuits, there is an ongoing attempt to increase the density of transistors.

One solution to achieve this consists of distributing transistors on several levels of semiconducting layers positioned on top of each other.

Such circuits thus generally have a lower level provided with a first semiconducting layer starting from which the transistors are formed and at least one upper layer provided with at least one second semiconducting layer from which transistors are formed, the first and second semiconducting layers being superposed and separated from each other by at least one insulating layer.

The "A 14 nm Finfet Transistor-level 3D partitioning Design to Enable High Performance and Low-Cost Monolithic 3D IC" document by Shi et al., IEDM 2016 presents an example of a 3D circuit.

Production of the circuit can involve the use of an assembly step by bonding between a lower level in which transistors have already been made and a support in which the semiconducting layer of a higher level is integrated.

Assembly between the support and the lower level is generally made by direct bonding, in other words without needing to provide any intermediate glue, typically between a silicon oxide layer of the support and an oxide layer formed on the lower level.

Such bonding may require a heat treatment. However, an excessively high temperature can induce degradation of the lower level(s) and particularly deterioration of the material of the contacts in the lower level or inter-level connection elements or even accidental diffusion of dopants within the lower level.

Therefore, one objective is generally to limit the thermal budget for bonding. In particular, it might be required to use heat treatments with temperatures higher than 550° C.

However, under some conditions, particularly when the oxide layers are thin and the bonding temperature is low, and particularly less than 550° C., a hydrogen degassing phenomenon can occur and generate bonding defects.

In some cases, molecular bonding can also cause untimely oxidation of the upper level semiconducting layer located in the support.

Therefore in particular the problem arises of finding a new method of making a circuit with superposed transistors that is better with regard to the disadvantages mentioned above.

PRESENTATION OF THE INVENTION

According to one aspect, this application relates to a method of making a circuit with superposed transistors comprising steps to:

a) provide a structure comprising at least one lower level of one or several transistors with a channel region formed in a first semiconducting layer supported on a substrate, said transistors being covered with at least one insulating layer in which one or several connection elements are formed, said structure being coated with one or several areas made of a given oxygen getter material capable of oxidising, b) assemble said structure with a support provided with at least one second semiconducting layer in which one or several channels of one or several higher level transistors are provided, the second semiconducting layer being coated with a thin layer of silicon oxide, the assembly of said structure and the support being made by bonding in which the thin silicon oxide layer is bonded to oxidised portions of said one or several areas of said given oxygen getter material.

The bonding is typically called direct bonding.

The area(s) of getter material may be oxidised before an annealing step under an oxidising atmosphere or can oxidise during a annealing step that is conducted to consolidate a bonding interface between the structure and the support.

In both cases, the area(s) of a given getter material act as oxygen absorbing elements and participate in producing a stronger bonding interface with fewer defects. If there is no oxygen getter, the degassed hydrogen could possibly react with available oxygen atoms and form —OH groups that migrate to the surface less quickly than hydrogen. In particular, these —OH groups may be concentrated at the bonding interface, particularly when the thermal budget is reduced, and create bonding defects.

The areas(s) of given getter material may also prevent or limit untimely oxidation of the support.

The given oxygen getter material may for example be Ti, or unhydrogenated Si, or Mo, or Ru. Such materials make it possible to form stable oxides that can create chemical bonds with the thin oxide layer and thus create good bond on this thin oxide layer.

It is thus possible to have a bonding interface comprising oxidised portions based on TiOx or $TiO_2$, or $SiO_2$, or $MoO_2$, or $RuO_2$.

Said one or several areas of a given oxygen getter material that can oxidise can be located on one or several conducting regions respectively, said conducting regions themselves being located on said one or several connection elements, respectively.

Advantageously, at least a first conducting region among said conducting regions may form a control electrode of the channel of a given transistor in said upper level or a ground plane of said given transistor.

The first conducting region forming a control electrode can thus be coupled by electrostatic or capacitive coupling to the second semiconducting layer. Such a layout typically requires a support provided with a thin layer of silicon oxide, for example less than 20 nm thick. Despite the thinness of this layer, the areas(s) of getter material assure that there are no bonding defects due to degassing phenomena.

Advantageously, according to a possible embodiment of the method, at least one first conducting region among said conducting regions forms a control electrode of the channel given of a given transistor in said upper level and is made on a first connection element, the first conducting region comprising a first stack of metallic layers, said first stack being coated with an area based on said given oxygen getter material, at least one second conducting region among said conducting regions being made on another connection element and formed from a second stack of metallic layers different from said first stack, said second stack being coated with another area based on said given oxygen getter material. This second conducting region can advantageously form another control electrode of the channel of another transistor in said upper level.

A first conducting region can thus be provided with a first output work and a second conducting region can be provided with a second output work. This makes it possible to have transistors with different threshold voltages between the given transistor for which the channel is connected to the first conducting region and the other transistor for which the channel is connected to the second conducting region, for the same biasing and similar configurations.

In step a), said structure can advantageously be provided with several conducting regions, each coated with an area based on an oxygen getter material.

Said conducting regions can advantageously be separated from each other by at least one silicon oxide block. This silicon oxide block can be made before bonding the structure and the support. Such an arrangement makes it possible to avoid the necessity to make STI type isolation trenches and therefore the need to make trenches between higher level transistors that would be prolonged between subjacent control electrodes.

In this case, the structure and the support are also assembled by bonding between the thin layer of silicon oxide and the silicon oxide block. The silicon oxide block can also be distributed around conducting regions.

According to one particular embodiment, the silicon oxide block can be made by:
- formation of a trench between a first conducting region and a second conducting region among said conducting regions,
- fill said trench with at least one layer of silicon oxide,
- planarise said layer of silicon oxide. In this case, areas of getter material and the oxide block produced are approximately at the same height, which can improve the bond with the support.

Advantageously, when this oxide block is made and before said silicon oxide layer is made, a layer of dielectric material is formed that acts as a barrier to the diffusion of copper coating the bottom and the side walls of said trench.

According to one particular embodiment, said insulating layer in which said one or several connection elements are formed may comprise a surface layer made of silicon oxide that can also be bonded to said thin layer of silicon oxide during said assembly of the support and the structure by bonding.

Each of said connection elements may comprise an upper end portion passing through said surface layer made of silicon oxide. In this case, production of said conducting regions coated with areas made of an oxygen getter material can include steps to:
- remove said end portions so as to form holes in the surface layer exposing remaining portions of said connection elements, then
- formation of conducting regions and then areas of a given oxygen getter material in the holes. Such a variant forms conducting regions connected with connection elements in the lower level, in a self-aligned manner.

According to one particular embodiment, at least one given connection element among said connection elements is based on copper. In this case, at least one of said conducting regions can be provided with a conducting layer forming a barrier to diffusion of copper in contact with said copper connection element.

According to another aspect, one embodiment of this invention relates to a device with superposed transistors comprising: at least one lower level of one or several transistors with a channel region formed in a first semiconducting layer supported on a substrate, said lower level transistors being covered with at least one insulating layer in which one or several connection elements are formed and that are connected to one or several conducting regions respectively, the conducting regions being coated with one or several oxide layers respectively, made of a given oxidised oxygen getter material, particularly such as $TiO_2$, or $MoO_2$, or $RuO_2$, or $SiO_2$, said oxide areas being assembled with a thin layer of silicon oxide of a support provided with at least one second semiconducting layer in which one or several channels of one or several transistors respectively of a higher level is (are) formed, the thin silicon oxide layer being coated with the second semiconducting layer, at least one first conducting region among said conducting regions forming a channel control electrode or forming a ground plane of a given higher level transistor, the channel of which extends in the second semiconducting layer.

Advantageously, the first conducting region is coated with an insulating stack formed from an oxide layer among said oxide areas made of a given oxidised oxygen getter material, and a thin layer of silicon oxide, the thickness and the composition of the isolating stack being designed to enable electrostatic coupling between the first conducting region and the channel of said given transistor.

According to one embodiment, the first conducting region can be connected to a copper-based connection element. In this case, the first conducting region is advantageously provided with a conducting layer forming a barrier to diffusion in contact with said given copper connection element.

According to one particular embodiment, the copper-based connection element can be formed from a conducting line connected to another conducting line through a vertical conducting element also called a via. In this case, the copper-based connection element can be surrounded by a barrier to diffusion of copper.

Advantageously, the first conducting region can itself be surrounded by a layer of dielectric material forming a diffusion barrier.

According to one particular embodiment of the device, said conducting regions include: a first conducting region formed from a stack of metallic layers and at least one second conducting region in position formed from another stack of metallic layers. With such an arrangement, it is possible to have transistors coupled to the first and second regions respectively, with different threshold voltages, possible for the same biasing.

BRIEF DESCRIPTION OF THE DRAWINGS

This invention will be better understood after reading the description of example embodiments given purely for information and in no way limitative with reference to the appended drawings on which.

Identical, similar or equivalent parts of the different figures have the same numeric references to facilitate the comparison between different figures.

The different parts shown on the figures are not necessarily all at the same scale, to make the figures more easily understandable.

Furthermore, in the following description, terms that are dependent on the orientation of the structure such as "on", "below", "above", "vertical", "horizontal", "lower", "upper" should be understood assuming that the structure is oriented as shown in the figures.

DETAILED PRESENTATION OF PARTICULAR EMBODIMENTS

Figure 1:
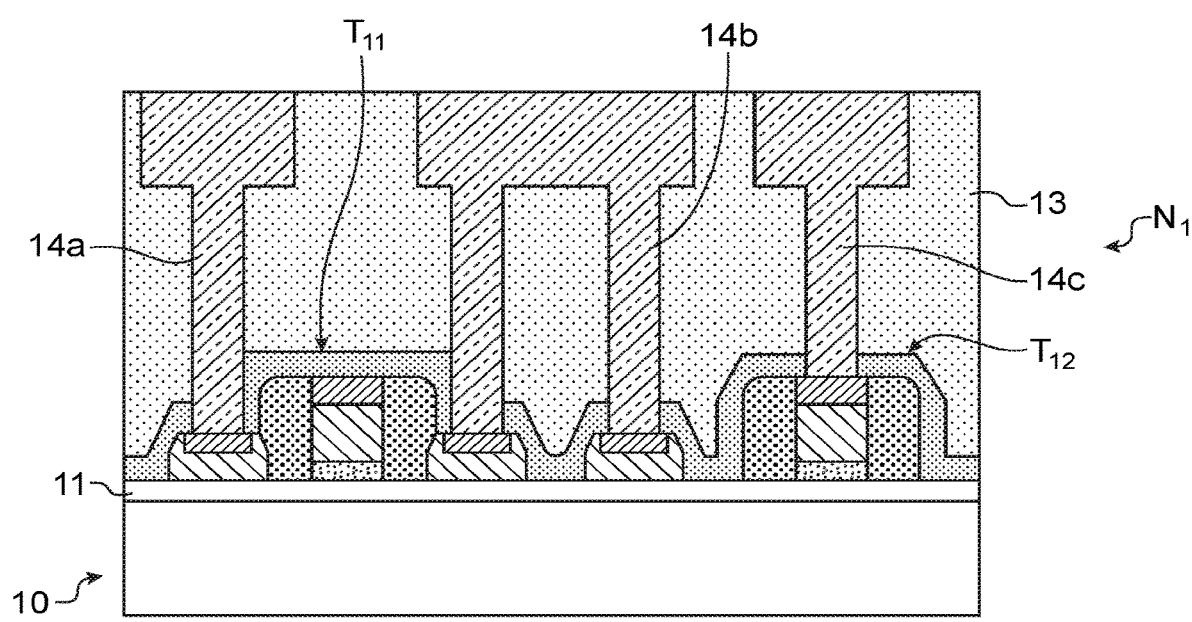
FIG. 1 illustrates an example of one possible initial structure for the use of a device with several superposed component levels according to a first embodiment of this invention.

Refer to FIG. 1 that illustrates a possible initial structure for a method according to the invention.

This structure comprises a substrate 10 on which at least one level $N_1$ provided with one or several electronic components, particularly transistors $T_{11}$, $T_{12}$, has been formed.

The transistors $T_{11}$, $T_{12}$ have a channel region arranged in a first semiconducting layer 11 and can be used on a bulk substrate 10 or on a semiconductor on insulator type substrate, and particularly on a SOI "Silicon On Insulator" type substrate, advantageously using the FDSOI ("Fully Depleted Silicon On Insulator") technology.

The transistors $T_{11}$, $T_{12}$ are covered with at least one insulating layer 13 in which one or several through conducting elements 14a, 14b, 14c connected to the transistor(s) are at least partially formed.

An interconnection elements stage 22a, 22b, 22c passing through at least one insulating layer is typically formed on transistors level $N_1$.

One manner of fabricating such interconnection elements 22a, 22b, 22c is to use a "Back-end-of line" (BEOL) type method, particularly using a Damascene or double-Damascene technique. In this case, the interconnection elements 22a, 22b, 22c can be made of copper and formed in trenches coated with a copper diffusion barrier 21. Such a barrier 21 is typically formed from a stack of Ti/TiN or Ta/TaN. It is thus possible to make a copper diffusion barrier encapsulation below and laterally using this stack. Another example of a material that can be used for the interconnection elements 22a, 22b, 22c is Ru.

As a variant, the interconnection elements 22a, 22b, 22c can be made of W or Co. In this case, the diffusion barrier layer may be optional.

Figure 2A:
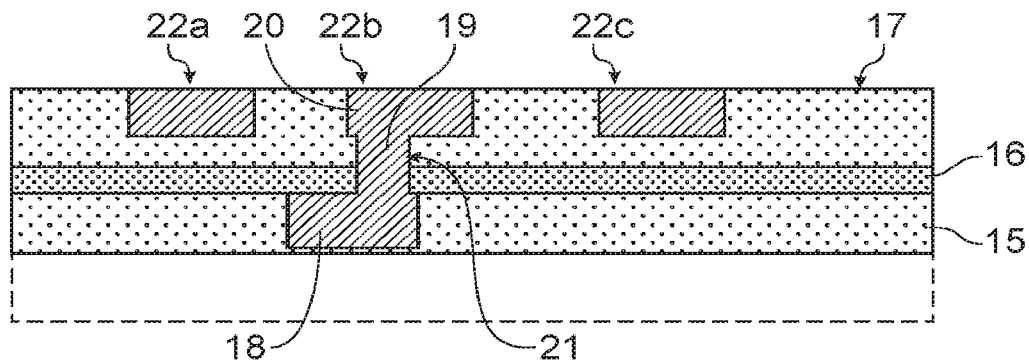
FIG. 2A illustrates another example of a possible starting structure from which a method according to a first embodiment of the invention may be implemented.

In the particular example illustrated on FIG. 2A, a connection element 22b is formed from a lower conducting line 18, typically horizontal or approximately horizontal, arranged in an insulating layer 15, for example made of SiOCN, this row 18 possibly being encapsulated laterally by a conducting diffusion barrier 21 for example formed in a Ti/TiN or Ta/TaN stack and on top by a dielectric barrier layer 16, for example made of SiN. A vertical conducting element 19 also called a "via" passing through the dielectric barrier layer 16 connects the lower conducting line 18 to a higher conducting line 20, typically horizontal or approximately horizontal, and made in an insulating layer 17, for example made of SiOCN. Filling of the trenches passing through the insulating layer(s) can be followed by a CMP ("Chemical mechanical planarization") polishing step. The result obtained is thus a structure of the type illustrated on FIG. 2A. This structure can also be used as a possible initial structure for use of a method according to the invention.

The next step is to make one or several conducting regions advantageously designed to form one or several electrodes called the "back" control or ground plane electrodes of one or several transistors on a higher level at the previously formed level $N_1$.

Figure 2B:
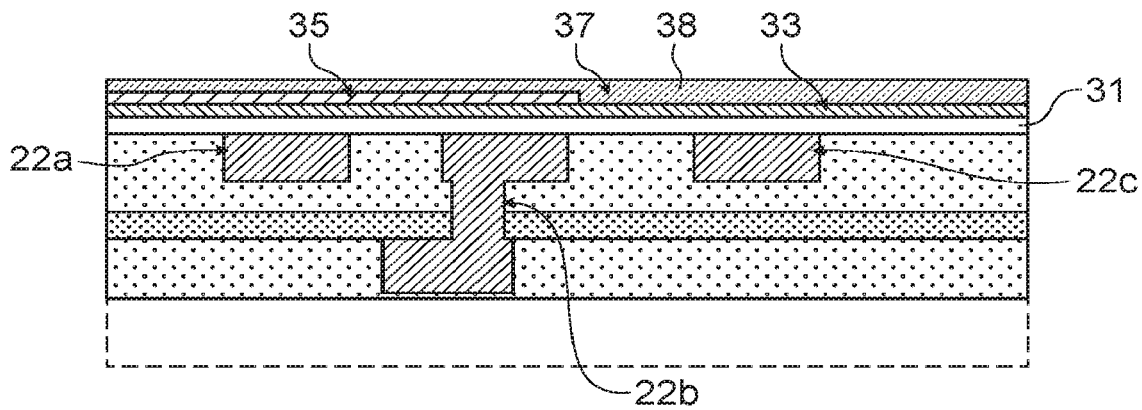
FIGS. 2B-2H illustrate an example of a method according to the invention, in which areas of oxygen getter material, once oxidised, enable better bonding between a structure and a support each comprising a semiconducting host level on which electronic components may be installed.

To achieve this, a stack of conducting layers 31, 33, 35 is formed. The stack preferably comprises a conducting layer 31 arranged directly on connection elements 22a, 22b, 22c, in other words in contact with these elements. In the particular example embodiment illustrated on FIG. 2B, when the connection elements are made of copper, this conducting layer 31 is a copper diffusion barrier layer covering connection elements 22a, 22b, 22c. The barrier layer 31 is for example formed from a stack of Ti and TiN. The thickness of the barrier layer 31 may for example be between 3 and 10 nm. A layer 33 composed of a metallic material is then deposited. In the illustrated example, the layer 33 composed of a metallic material is a "solid plate", in other words it covers the entire upper face of the initial structure. The metallic material is chosen as a function of the output work to be assigned to the "back" electrodes. The layer 33 of metallic material can for example be based on TiN or TaN or W and its thickness may for example be between 3 and 15 nm.

On some local parts, the stack may advantageously comprise an additional conducting layer 35. In the example embodiment illustrated, the conducting layer 35 is an additional metallic layer that extends facing one or several connection elements 22a, 22b, but not facing the connection element 22c. The material of the conducting layer 35 is chosen as a function of the output work to be assigned to at least one particular "back" electrode. Different output work can then be obtained for an electrode that will be formed in the stack of layers 31, 33, and for another electrode that will be formed in the stack of layers 31, 33, 35, and therefore comprising this additional layer to adjust the output work. A conducting layer 35 based on TiN or TaN or W with a thickness that may for example be between 3 and 15 nm can be provided.

The stack of layers 31, 33, 35 is then coated with a surface layer 37 made of an oxygen trapping material 38 that can oxidise.

In other words, the material 38 is an oxygen getter material that can oxidise. The material 38 is preferably a material that, when it is in the oxidised form, can have a large adhesion capacity with a silicon oxide layer that can be formed later. For example, the material 38 can be based on titanium, or non-hydrogenated amorphous silicon or molybdenum or ruthenium. Typically, the thickness of the material 38 is chosen, particularly as a function of the solubility of oxygen in the material.

For example, when the getter material 38 is Ti, it can be considered that the theoretical solubility of oxygen in the Ti is for example of the order of 33%. Generally, direct bonding is done using a hydrophilic preparation and is accompanied by the adsorption of some monolayers of water that produce a non-stoichiometric oxide TiOx. The preparation step enables the formation of oxide and may include a CMP or plasma activation step or an ozone UV exposure step.

If it is required to obtain a TiOx layer of the order of 2 nm thick, a thickness of material 38 for example equal to the order of at least 10 nm thick can be chosen. This value takes account of a case in which the area of oxidised getter material would occupy the entire surface that is to be bonded later with a support. However, the thickness of material 38 chosen might also depend on the ratio of the area that this material 38 will occupy in the bonding interface that will be made later.

Figure 2C:
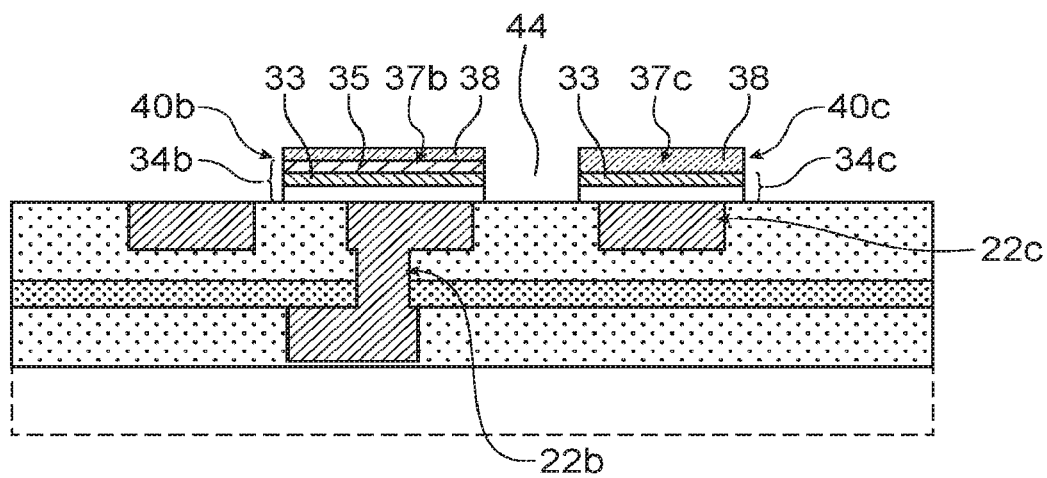

According to a subsequent step illustrated on FIG. 2C, the superposition of layers 31, 33, 35, 37 is etched so as to form distinct blocks 40b, 40c and thus define distinct back electrodes.

On a first connection element 22b, a first block 40b is thus formed comprising a stack of a first conducting region 34b coated with a first area 37b made of an oxygen trapping material 38 on this first conducting region 34b. On a second connection element 22c, a second block 40c is formed comprising a stack of a second conducting region 34c coated with a second area 37c made of an oxygen trapping material 38 on this second conducting region 34b.

An insulating area is then formed between distinct blocks 40b, 40c and also preferably around the blocks 40b, 40c, in order to form at least electrical insulation between the back electrodes, insulation around these electrodes also being possible.

Figure 2D:
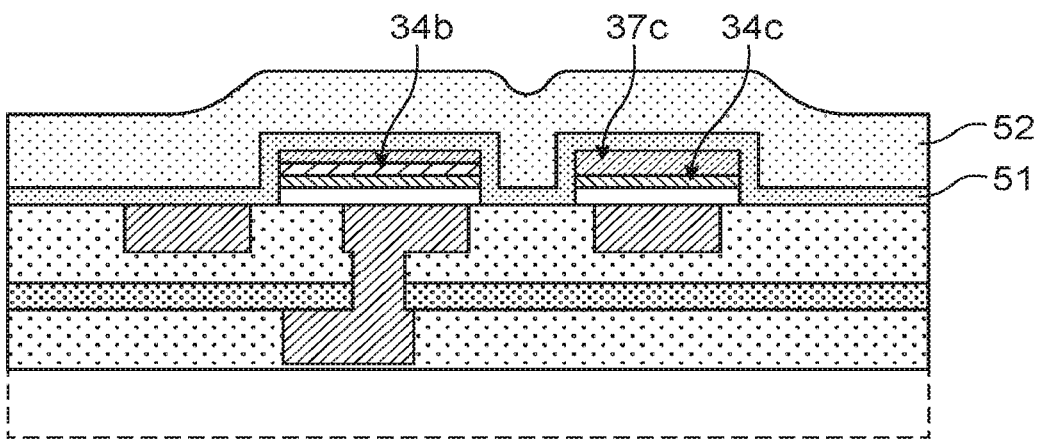

The insulating area can also be made as shown in the example in FIG. 2D by deposition of a stack of layers 51, 52 made of dielectric materials.

A dielectric layer 51, that can be made by conforming deposition, is deposited first. The dielectric layer 51 can be made of a material capable of forming a copper diffusion barrier, for example such as SiCN. The thickness of this dielectric layer 51 may for example by of the order of 15 nm.

A trench is then filled between blocks 40b, 40c by a layer 52 made of another dielectric material chosen so that it can act as a bonding material ready for subsequent assembly of the structure with another support. The envisaged bonding is direct bonding. The layer 52 is typically made of silicon oxide. The thickness of this dielectric layer 52 may for example by of the order of 20 nm or less.

As suggested previously, the thickness of the material 38 formed in the blocks 40b, 40c is also preferably chosen as a function of the ratio of the area that this material 38 will occupy to the total area of the bonding interface.

When a structure covered with getter material blocks and oxide blocks is bonded, allowance is made for the ratio of the area occupied by the getter material to the total area including the getter material blocks and the oxide blocks. For example, considering a getter material 38 made of Ti in which the ratio of the area occupied by this material 38 to the total area of the bonding interface also composed of 50% of the $SiO_2$ layer 52 is equal to 50%, a thickness of material 38 equal for example to the order of 20 nm can be provided.

The thickness of material 38 can also be chosen as a function of the distribution of blocks and more particularly the spacing between them.

Figure 2E:
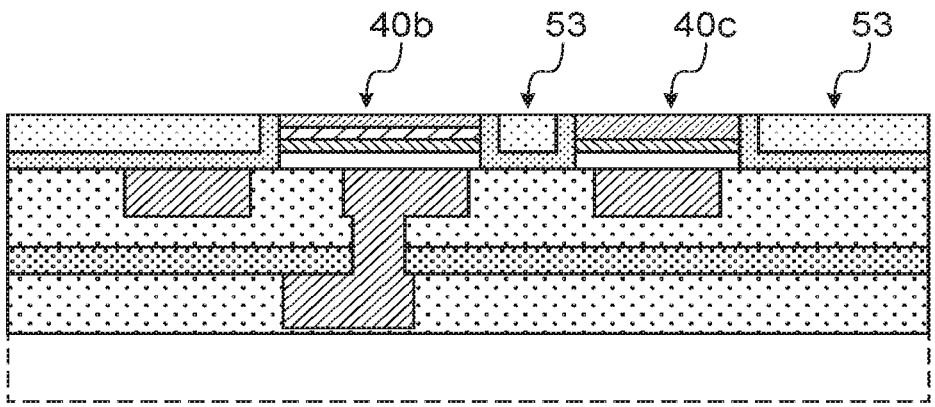

The dielectric layers 51, 52 are then planarised, for example by CMP, so as to obtain insulating areas 53 between and around the blocks 40b, 40c and with the same height as these blocks 40b, 40c (FIG. 2E).

The result obtained is thus an upper face that is plane or has little relief so as to facilitate subsequent assembly by direct bonding with a support 100.

Figure 2F:
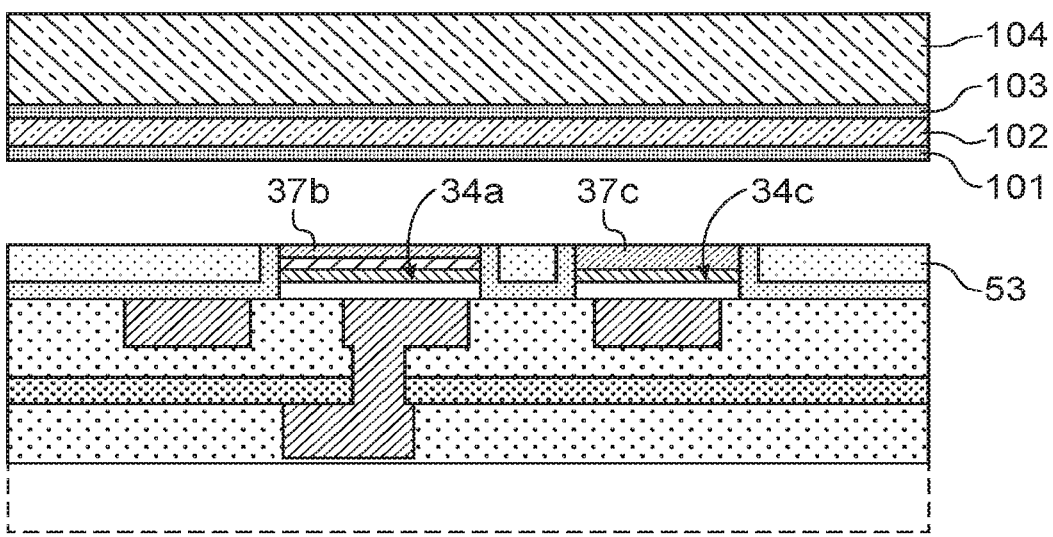
Figure 2G:
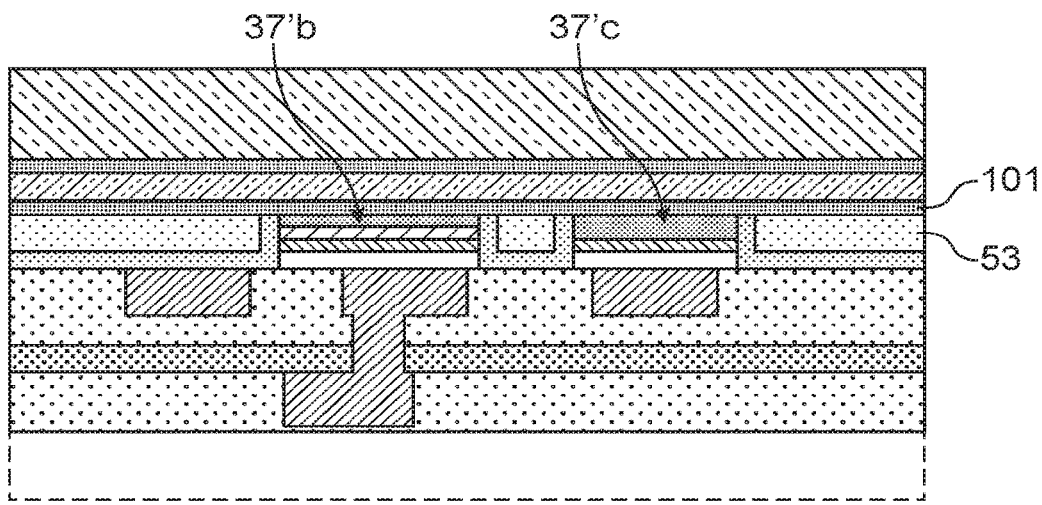

Such an assembly by direct bonding is illustrated for example on FIGS. 2F-2G.

The support 100 that is transferred onto the previously made structure is coated with a thin layer of dielectric oxide 101. The support is also provided with at least one semiconducting layer 102 from which an upper transistor level is made. The thickness of the semiconducting layer 102 of the support 100 may for example be between several nanometres 50 nm and 50 nanometres. Typically, the semiconducting layer 102 of the support 100 is arranged on one or several layers 103, 104, in particular with an etching stop layer 103 for example made of silicon oxide and a thick mechanical support layer 104 made for example of silicon.

The thin dielectric oxide layer 101 may be thin enough so that electrostatic coupling (also called capacitive coupling) can be established later between the semiconducting layer 102 and one or several previously formed back electrodes. The thin dielectric oxide layer 101 is advantageously a thermal oxide layer typically based on silicon oxide with a thickness that may be less than 20 nm, for example between 10 and 20 nm.

Advantageously, a waiting time can be included between hydrophilic preparation in view of bonding and the thermal annealing step. Such a waiting time, for example of the order of several tens of minutes or more than an hour, and that can be adapted depending on the spacing between the different blocks 40a, 40b, can give the water molecules that move freely at a velocity for example of the order of 160 μm/h sufficient time to distribute in the different blocks 40a, 40b.

Assembly by direct bonding typically comprises thermal annealing at a temperature for example between 200° C. and 550° C., for a duration that may for example be of the order of one hour. In this example, annealing is done under an oxidising atmosphere. The blocks 40b, 40c coated with an oxygen trapping material 38 absorb oxygen and are superficially oxidised.

The result is thus that oxidised portions 37'b, 37'c are formed that have good adhesion with the dielectric oxide 101.

Oxidation prior to thermal annealing is also possible. Thermal annealing can then reinforce adhesion.

The insulating areas 53 formed around the blocks 40a, 40b coated with oxidised portions 37'b, 37'c also bond to the dielectric oxide 101 when they are made of silicon oxide and can thus participate in bonding.

Figure 2H:
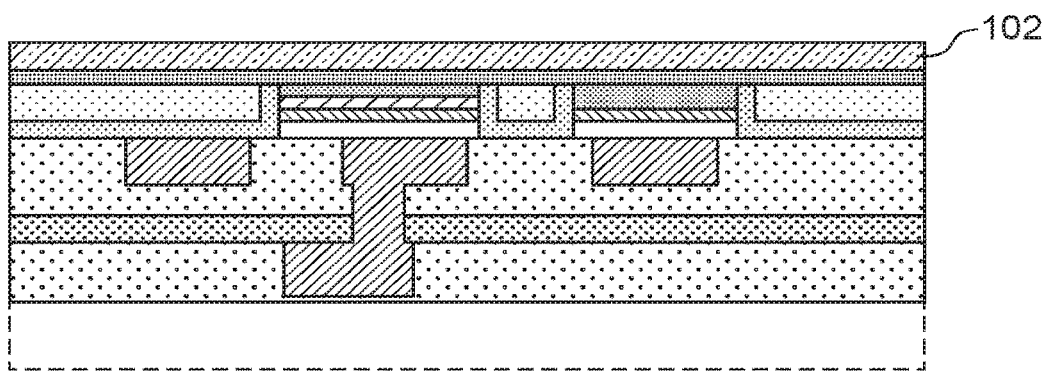

Once the assembly is complete, the next step is to remove the layers 103, 104 of the support when they are present, for example using etching and planarisation (CMP) steps and so as to expose the semiconducting layer 102 from which one or several transistors can be formed (FIG. 2H).

Thus, steps are then typically performed to form active areas in the semiconducting layer 102, and then on this semiconducting layer 102 of electrodes of transistor gates on a higher level $N_2$, then contact elements.

Figure 3:
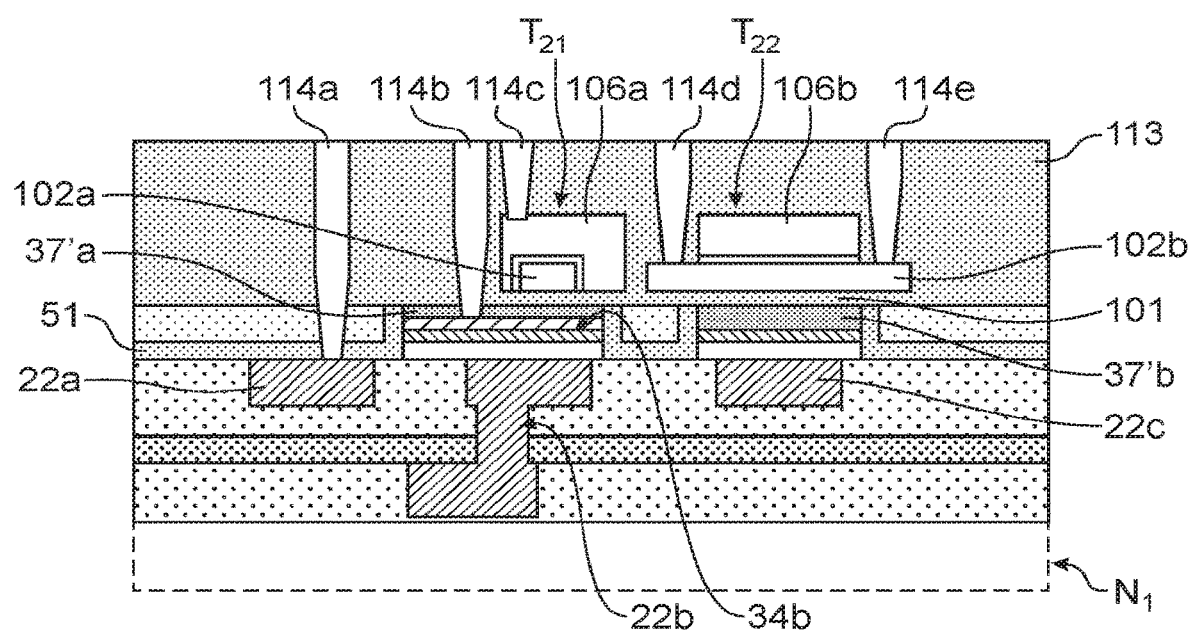
FIG. 3 illustrates an example of a superposed transistors device making use of a method according to the invention, the device being provided with a higher level with one or several transistors comprising a gate electrode and a back control electrode.

In the example illustrated on FIG. 3, distinct semiconducting portions 102a, 102b are formed from the semiconducting layer 102 transferred to the lower layer $N_1$ of transistors. A transistor channel $T_{21}$ is provided in a first semiconducting portion 102a, while there is a channel of another transistor $T_{22}$ in another semiconducting portion 102b, separated from the first portion 102a. In the particular example illustrated, different types of transistors $T_{21}$, $T_{22}$ are made, and particularly transistors with different gate and channel structures. The transistor $T_{21}$ has a surrounding gate structure 106a covering the upper face and the side faces of a semiconducting portion 102a in the form of a fin. The transistor $T_{22}$ has a structure with a plane gate 106b located on the semiconducting portion 102b. The gates 106a, 106b can for example be formed from a stack of polysilicon and TiN on a gate dielectric formed from a stack of $HfO_2$ and $SiO_x$.

The transistors $T_{21}$ and $T_{22}$ can be isolated from each other by a Shallow trench isolation ("STI") type isolation, or preferably of a type commonly called "mesa", in other words without making trenches under the transistors.

The conducting regions 34b, 34c located underneath the channel region of the first transistor $T_{21}$ and under the channel region of the other transistor $T_{22}$ respectively can be coupled by capacitive or electrostatic coupling to these channel regions and can thus form addition control regions for these channel regions. The possibility of setting up such coupling depends on the composition and thickness of an insulating stack separating each conducting region 34a (or 34b) from the semiconducting channel portion 102a (or 102b respectively) facing it.

In other words, it depends particularly on the thickness and composition of the thin layer of silicon oxide 101 and the thickness and composition of the area of oxidised getter material located under the semiconducting portions 102a, 102b.

The transistors $T_{21}$, $T_{22}$ are covered with at least one insulating layer 113 in which one or several conducting elements 114b, 114c, 114d, 114e are made. A conducting element 114a can be used to make contact with the interconnection level arranged on the lower level $N_1$ of transistors, while conducting elements 114c, 114d, 114e can be used to make contact with transistors $T_{21}$ and $T_{22}$ on the higher level $N_2$. In the example illustrated, a conducting element 114b makes contact on the conducting region 34b forming a back electrode of the transistor $T_{21}$.

A variant embodiment will now be described with reference to FIGS. 4A-4D.

The initial structure is similar to the structure described above with reference to FIG. 2A with connection elements 22a, 22b, 22c formed above the lower level $N_1$ of transistors. One end of these connection elements 22a, 22b, 22c is formed in a thickness of insulating material comprising a surface layer 17', typically made of silicon oxide.

The next step is to remove end portions of connection elements 22a, 22b, 22c so as to form holes 23a, 23b, 23c, in the insulating thickness and particularly in the surface layer 17'. The holes 23a, 23b, 23c made expose the connection elements 22a, 22b, 22c. For example, a thickness corresponding approximately to the depth of the holes 23a, 23b, 23c can be removed, for example of the order of several tens of nanometres.

Conducting regions are then formed in the holes 23a, 23b, 23c, and will be used to form back control electrodes.

These conducting regions are formed typically by making a stack of conducting layers 31, 33, a copper diffusion barrier conducting layer 31 being formed for example of Co or a stack of Ti and TiN and a layer 33 made of a metallic material.

Different stacks can be used from one hole to another so as to be able to make back control electrodes as described above, with different compositions for different transistors.

Thus, an additional conducting layer 35 is formed in one or several holes 23a, 23b, this additional conducting layer 35 not being located in at least one other hole 23c.

Such a selective filling can be made for example by masking 28, for example based on resin or nitride, typically formed by photolithography, on parts of the structure on which it is required to make the additional layer 35.

Figure 4A:
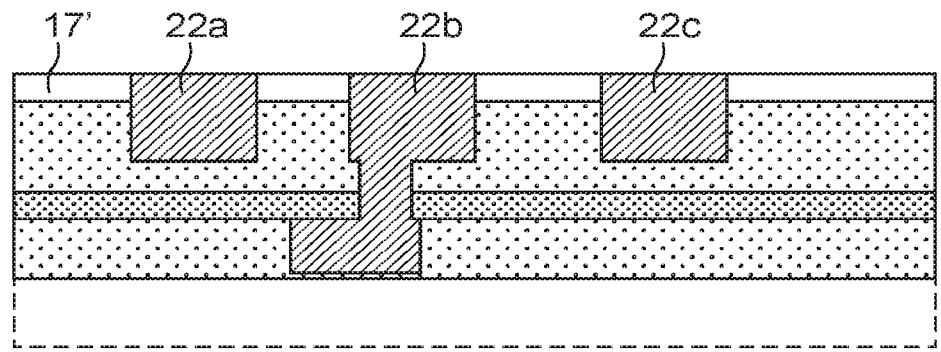
FIGS. 4A-4F illustrate an example variant of the method according to the invention.
Figure 4B:
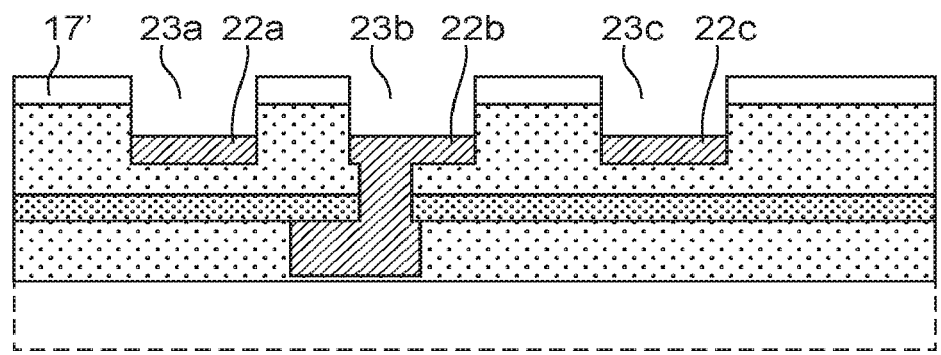
Figure 4C:
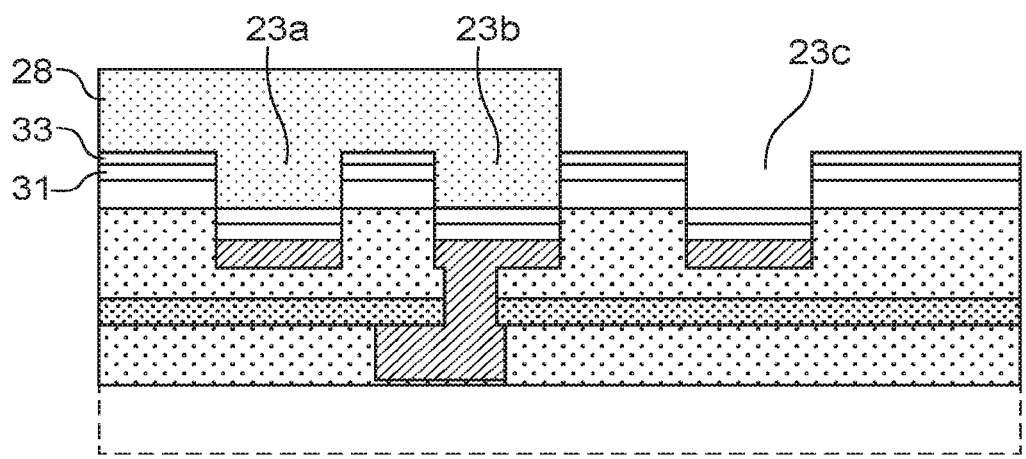

In the example illustrated on FIG. 4C, the hole 23c is not protected by masking 28, while other holes 23a, 23b are covered by masking 28.

The additional conducting layer 35 is then etched at unmasked parts. The mask 28 is then removed.

In this example embodiment, and since conducting regions are made in holes, when the connection elements 22a, 22b, 22c are made of copper, the first conducting layer 31 of the stack forming the conducting regions can be sufficient to form a diffusion barrier. Thus, in this example, the diffusion barrier can be made by a metallic layer rather than by means of a layer of dielectric material.

Figure 4D:
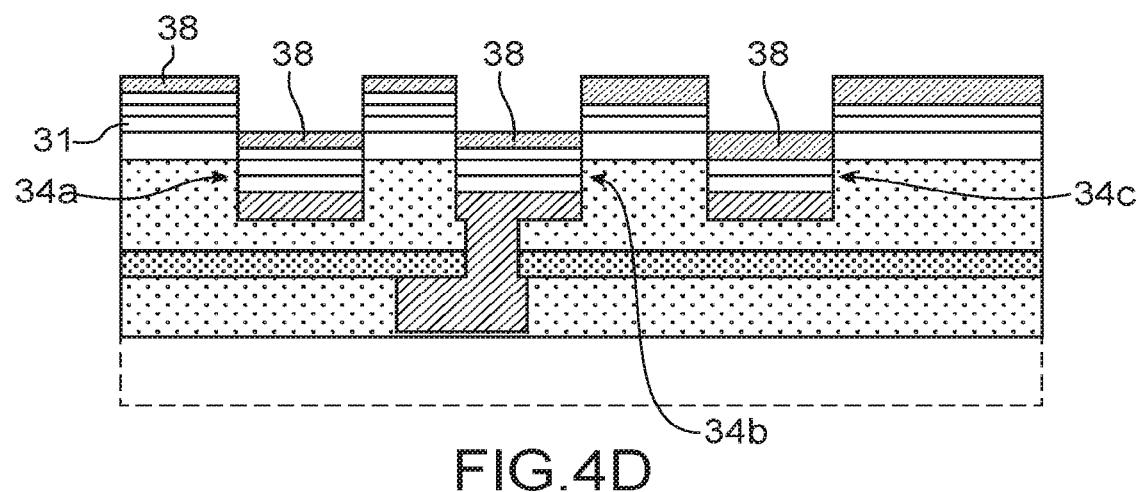

FIG. 4D illustrates a later step in the formation of a layer of material 38 capable of absorbing oxygen and oxidising on the structure. Some areas of oxygen getter material 38 are formed in holes 23a, 23b, 23c and cover the different conducting regions 34a, 34b, 34c made in the holes.

Figure 4E:
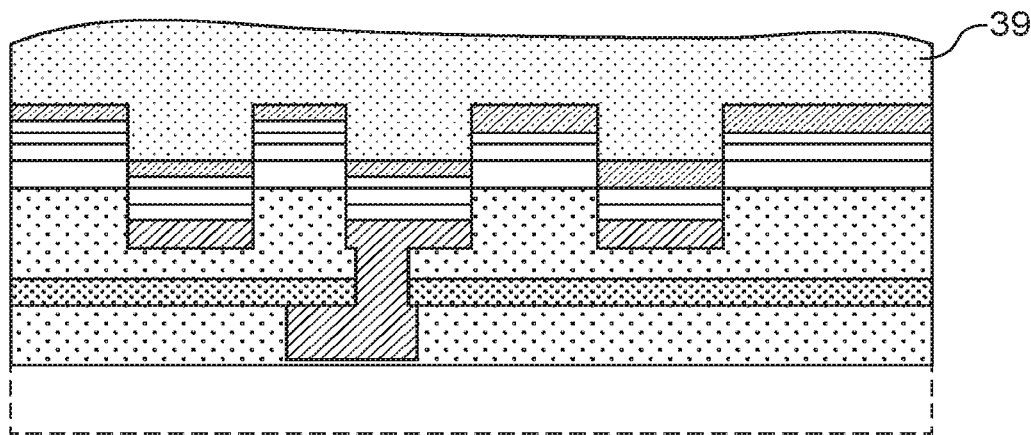

Planarisation (CMP) is then conducted to remove layers deposited around the holes and projecting beyond the opening of the holes. To achieve this, the first step is to form an insulating layer 39, for example silicon oxide, as shown on FIG. 4E.

The conducting regions and the areas of getter material 38 cover these regions are thus kept only in the holes 23a, 23b, 23c.

Figure 4F:
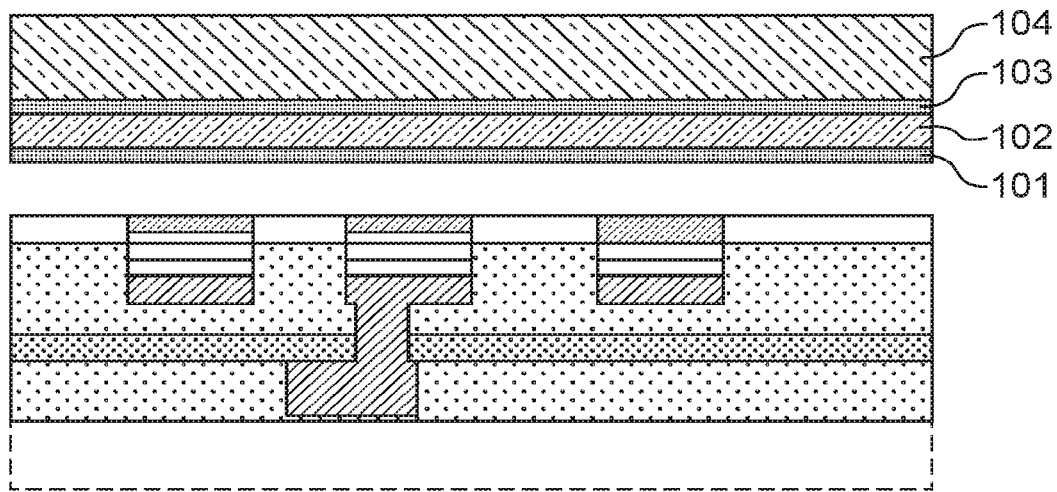

After making the removal, the support 100 provided with the thin layer of dielectric oxide 101 used for bonding can be assembled with the semiconducting layer 102 in which the transistor channels are provided (FIG. 4F).

The invention claimed is:

1. A method of making a circuit with superposed transistors comprising:
    a) providing a structure comprising at least one lower level of one or several transistors with a channel region formed in a first semiconducting layer supported on a substrate, said transistors being covered with at least one insulating layer in which one or several connection elements are formed, said structure being coated with one or several oxygen getter material areas made of a given oxygen getter material capable of oxidizing, and
    b) assembling said structure with a support, said support being provided with at least one second semiconducting layer in which one or several channels of one or several higher level transistors are provided, said second semiconducting layer being coated with a thin layer of silicon oxide,
    the assembling of said structure and said support comprising superficially oxidizing said oxygen getter material areas, the assembling further comprising a direct by bonding step so that the thin silicon oxide layer is brought directly into contact with and directly bonded to superficially oxidized portions of said one or several oxygen getter material areas, so as to make a bonding interface between superficially oxidized portions of said given getter material and the thin silicon oxide layer.

2. The method according to claim 1, wherein said given oxygen getter material is chosen from among the following materials: non-hydrogenated Ti, Mo, Ru, Si.

3. The method according to claim 1, wherein said one or several areas of a given oxygen getter material that can oxidise are located on one or several conducting regions respectively, said conducting regions being located on said one or several connection elements, respectively, at least one of said conducting regions forming a control electrode of the channel of a given transistor in said upper level or a ground plane of said given transistor.

4. The method according to claim 1, wherein at least one first conducting region among said conducting regions forms a control electrode of a channel of a given transistor in said upper level and is made on a first connection element, the first conducting region comprising a first stack of metallic layers, said first stack being coated with an area based on said given oxygen getter material, at least one second conducting region among said conducting regions being made on another connection element and formed from a second stack of metallic layers different from said first stack, said second stack being coated with another area based on said given oxygen getter material.

5. The method according to claim 1, wherein in step a), said structure has several conducting regions, each coated with an area based on an oxygen getter material, said conducting regions being separated from each other by at least one block made of silicon oxide, the structure and the support also being assembled by bonding between the thin layer of silicon oxide and the silicon oxide block.

6. The method according to claim 5, wherein the production of said silicon oxide block includes the following steps:
creating a trench between a first conducting region and a second conducting region among said conducting regions,
filling said trench with at least one layer of silicon oxide, and
planarizing said layer of silicon oxide.

7. The method according to claim 6, wherein before said silicon oxide layer is made, a layer of dielectric material is formed that acts as a barrier to the diffusion of copper coating a bottom and side walls of said trench.

8. The method according to claim 1, wherein said insulating layer in which said one or several connection elements are formed comprises a surface layer made of silicon oxide that can be bonded to said thin layer of silicon oxide during said assembly of the support and the structure by bonding, each of said connection elements comprises an upper end portion passing through said surface layer made of silicon oxide, the production of said conducting regions coated with areas made of a given oxygen getter material including steps to:
remove said end portions so as to form holes in the surface layer exposing remaining portions of said connection elements, then
form conducting regions and then areas of a given oxygen getter material in the holes.

9. The method according to claim 1, wherein at least one given connection element among said connection elements is made of copper, at least one of said conducting regions comprising a conducting layer forming a barrier to diffusion of copper in contact with said copper connection element.

10. The method according to claim 1, wherein the thin layer of silicon oxide comprises $SiO_2$.

11. A method of making a circuit with superposed transistors comprising:
a) providing a structure comprising at least one lower level of one or several transistors with a channel region fanned in a first semiconducting layer supported on a substrate, said transistors being covered with at least one insulating layer in which one or several connection elements are formed, said structure being coated with one or plural oxygen getter material areas made of a given oxygen getter material capable of oxidizing, said structure being further coated by an insulating zone provided around said oxygen getter material areas,
b) assembling said structure with a support, said support being provided with at least one second semiconducting layer in which one or several channels of one or several higher level transistors are provided, the second semiconducting layer being coated with a thin layer of silicon oxide,
wherein assembling said structure and the support comprises:
annealing under an oxidizing atmosphere so as to oxidize said oxygen getter material areas and to form oxidized portions of said one or several oxygen getter material areas of said given oxygen getter material, and
direct bonding, in which the thin layer of silicon oxide of said support is directly bonded to said oxidized portions and to said insulating zone of said structure, so as to make a bonding interface between surface oxide portions of said given getter material and the thin layer of silicon oxide and another bonding interface between said insulating zone and the thin layer of silicon oxide.

12. The method according to claim 11, wherein said given oxygen getter material is chosen from among the following materials: non-hydrogenated Ti, Mo, Ru, Si.

13. The method according to claim 11, wherein said one or several areas of a given oxygen getter material that can oxidise are located on one or several conducting regions respectively, said conducting regions being located on said one or several connection elements, respectively, at least one of first conducting regions forming a control electrode of the channel of a given transistor in said upper level or a ground plane of said given transistor.

14. The method according to claim 11, wherein at least one first conducting region among said conducting regions foil is a control electrode of a channel of a given transistor in said upper level and is made on a first connection element, the first conducting region comprising a first stack of metallic layers, said first stack being coated with an area based on said given oxygen getter material, at least one second conducting region among said conducting regions being made on another connection element and formed from a second stack of metallic layers different from said first stack, said second stack being coated with another area based on said given oxygen getter material.

15. The method according to claim 11, wherein at step a), said structure is provided with several conducting regions, each coated with an area based on an oxygen getter material, said conducting regions being separated from each other by at least one block made of silicon oxide, the structure and the support being assembled by bonding between the thin layer of silicon oxide and the silicon oxide block.

16. The method according to claim 15, wherein the production of said silicon oxide block includes the following steps:
creating a trench between a first conducting region and a second conducting region among said conducting regions,
filling said trench with at least one layer of silicon oxide, and
planarizing said layer of silicon oxide.

17. The method according to claim 16, wherein before said silicon oxide layer is made, a layer of dielectric material is formed that acts as a barrier to the diffusion of copper coating a bottom and side walls of said trench.

18. The method according to claim 17, wherein said insulating layer in which said one or several connection elements are fanned comprises a surface layer made of silicon oxide that can also be bonded to said thin layer of silicon oxide during said assembly of the support and the structure by bonding, each of said connection elements comprises an upper end portion passing through said surface layer made of silicon oxide, the production of said conducting regions coated with areas made of an oxygen getter material including:
removing said end portions so as to form holes in the surface layer exposing remaining portions of said connection elements, then forming conducting regions and then areas of a given oxygen getter material in the holes.

19. The method according to claim 11, wherein at least one given connection element among said connection elements is made of copper, at least one of said conducting regions comprising a conducting layer forming a barrier to diffusion of copper in contact with said copper connection element.

20. The method according to claim 11, wherein the thin layer of silicon oxide comprises $SiO_2$.

21. A method of making a circuit with superposed transistors comprising:
  a) providing a structure comprising at least one lower level of one or several transistors with a channel region formed in a first semiconducting layer supported on a substrate, said transistors being covered with at least one insulating layer in which one or several connection elements are formed, said structure being coated with one or several areas made of a given oxygen getter material capable of oxidizing, said structure being further coated by surface regions made of a material that is different from said given oxygen getter material, and
  b) assembling said structure with a support, said support being provided with at least one second semiconducting layer in which one or several channels of one or several higher level transistors are provided, the second semiconducting layer being coated with a thin layer of silicon oxide,
  wherein assembling of said structure and said support comprises:
    annealing under an oxidizing atmosphere so as to oxidize said areas of said given oxygen getter material and to form surface oxidized portions of said one or several areas of said given oxygen getter material, and
    direct bonding, in which said thin layer of silicon oxide is directly bonded to said surface regions and to said oxidized surface portions, so as to make a bonding interface between said oxide portions of said give getter material and the thin layer of silicon oxide.

22. The method according to claim 21, wherein:
said given oxygen getter material is chosen from among the following materials: non-hydrogenated Ti, Mo, Ru, and Si, and
said surface regions are made of silicon oxide.

23. The method according to claim 21, wherein the thin layer of silicon oxide comprises $SiO_2$.

* * * * *